(12) United States Patent
Fujimori

(10) Patent No.: US 11,056,673 B2
(45) Date of Patent: Jul. 6, 2021

(54) LIGHT EMITTING DEVICE

(71) Applicant: PIONEER CORPORATION, Tokyo (JP)

(72) Inventor: Jiro Fujimori, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 244 days.

(21) Appl. No.: 16/324,888

(22) PCT Filed: Feb. 2, 2017

(86) PCT No.: PCT/JP2017/003849
§ 371 (c)(1),
(2) Date: Feb. 11, 2019

(87) PCT Pub. No.: WO2018/061237
PCT Pub. Date: Apr. 5, 2018

(65) Prior Publication Data
US 2020/0259117 A1 Aug. 13, 2020

(30) Foreign Application Priority Data
Sep. 30, 2016 (JP) .............. JP2016-192992

(51) Int. Cl.
*H01L 51/52* (2006.01)
*H01L 51/56* (2006.01)
(Continued)

(52) U.S. Cl.
CPC .......... *H01L 51/5253* (2013.01); *H01L 51/56* (2013.01); *H05B 33/04* (2013.01); *H01L 23/562* (2013.01)

(58) Field of Classification Search
CPC . H01L 51/5253; H01L 51/5256; H01L 51/56; H01L 23/562; H05B 33/04
See application file for complete search history.

(56) References Cited

U.S. PATENT DOCUMENTS 5,686,360 A * 11/1997 Harvey, III ......... H01L 51/0097
438/28
5,811,177 A * 9/1998 Shi ..................... H01L 51/5259
428/209
(Continued)

FOREIGN PATENT DOCUMENTS

JP H09-185994 A 7/1997
JP 2007-141749 A 6/2007
(Continued)

OTHER PUBLICATIONS

International Search Report for related International Application No. PCT/JP2017/003849; dated May 9, 2017; 2 pages.

*Primary Examiner* — Errol V Fernandes
*Assistant Examiner* — Jeremy J Joy
(74) *Attorney, Agent, or Firm* — Procopio, Cory, Hargreaves & Savitch LLP

(57) ABSTRACT

A covering layer (240) is formed by atomic layer deposition (ALD) and contains an insulating inorganic material. An intermediate layer (220) contains a material having a linear expansion coefficient different from that of a material of the covering layer (240). A buffer layer (230) has a surface in contact with the intermediate layer (220), that is, a first surface. The buffer layer (230) has a surface in contact with the covering layer (240), that is, a second surface. A linear expansion coefficient difference between a material of the buffer layer (230) and the inorganic material of the covering layer (240) is less than a linear expansion coefficient difference between the material of the intermediate layer (220) and the inorganic material of the covering layer (240).

14 Claims, 8 Drawing Sheets

(51) Int. Cl.
*H05B 33/04* (2006.01)
*H01L 23/00* (2006.01)

(56) References Cited

U.S. PATENT DOCUMENTS

| | | | |
|---|---|---|---|
| 7,342,356 B2 * | 3/2008 | McCormick | H01L 51/5253 |
| | | | 313/506 |
| 7,538,354 B2 | 5/2009 | Hayashi et al. | |
| RE43,442 E | 6/2012 | Hayashi et al. | |
| 10,056,574 B2 | 8/2018 | Ishida et al. | |
| 2003/0230976 A1 * | 12/2003 | Nishikawa | H01L 51/524 |
| | | | 313/504 |
| 2006/0158111 A1 * | 7/2006 | Hayashi | H01L 51/5259 |
| | | | 313/512 |
| 2007/0114521 A1 * | 5/2007 | Hayashi | H01L 51/5246 |
| | | | 257/40 |
| 2015/0014646 A1 * | 1/2015 | Kaplan | H01L 51/56 |
| | | | 257/40 |
| 2015/0287959 A1 * | 10/2015 | Hanamura | H01L 51/0096 |
| | | | 257/40 |
| 2016/0380226 A1 * | 12/2016 | Hayashi | H01L 51/50 |
| | | | 257/40 |
| 2017/0279057 A1 * | 9/2017 | Park | H01L 27/3272 |
| 2018/0040849 A1 * | 2/2018 | Ishida | H01L 51/56 |
| 2018/0183006 A1 * | 6/2018 | Ishida | H01L 51/5246 |

FOREIGN PATENT DOCUMENTS

| | | |
|---|---|---|
| JP | 2015-176717 A | 10/2015 |
| JP | 2016-004760 A | 1/2016 |
| WO | 2016/132721 A1 | 8/2016 |

\* cited by examiner

LIGHT EMITTING DEVICE

CROSS-REFERENCE TO RELATED APPLICATIONS

This application is a U.S. National Stage entry of PCT Application No: PCT/JP2017/003849 filed Feb. 2, 2017, which claims priority to Japanese Patent Application No. 2016-192992, filed Sep. 30, 2016, the contents of which are incorporated herein by reference.

TECHNICAL FIELD

The present invention relates to a light emitting device.

BACKGROUND ART

In the recent years, an organic light emitting diode (OLED) has been developed as a light emitting device. The OLED has an organic layer that emits light by organic electroluminescence. Generally, such an organic layer is easily deteriorated by water or oxygen, for example. A sealing portion for sealing a light emitting portion (that is, organic layer) may be provided in the OLED in order to protect the organic layer from substances to deteriorate the organic layer.

Patent Document 1 discloses an example of the sealing portion for the OLED. In Patent Document 1, first, a first covering film ($AlO_x$ film) is formed by atomic layer deposition (ALD), then an intermediate film (SiN film) is formed by chemical vapor deposition (CVD), and then a second covering film ($AlO_x$ film) is formed by ALD. Thus, the sealing portion of Patent Document 1 has a stacked structure of the first covering film, the intermediate film, and the second covering film.

Patent Document 2 discloses another example of the sealing portion for the OLED. In Patent Document 2, first, a first barrier film (for example, aluminum oxide) is formed by ALD, then an organic film is formed by CVD, and then a second barrier film (for example, silicon nitride) is formed by CVD. The second barrier film may be formed by ALD. In this case, the second barrier film contains aluminum oxide, for example. Thus, the sealing portion of Patent Document 2 has a stacked structure of the first barrier film, the organic layer, and the second barrier film.

RELATED DOCUMENT

Patent Document

[Patent Document 1] Japanese Laid-open Patent Publication No. 2016-4760
[Patent Document 2] Japanese Laid-open Patent Publication No. 2015-176717

SUMMARY OF THE INVENTION

Technical Problem

The inventor has studied a sealing portion including two covering layers formed by ALD and an intermediate layer (organic layer) provided between the two covering layers. Studies of the inventor have revealed that such a sealing portion could experience cracking of the covering layer due to a linear expansion coefficient difference between the covering layers and the intermediate layer.

One example of the problems to be solved by the invention is to prevent cracking of a covering layer even if the covering layer formed by ALD is provided above or below an intermediate layer having a linear expansion coefficient different from that of the covering layer.

Solution to Problem

The invention according to claim 1 is a light emitting device comprising:
a light emitting portion positioned at a first surface side of a substrate and comprising a stacked structure of a first electrode, an organic layer comprising an emission layer, and a second electrode; and
a sealing portion covering the light emitting portion,
wherein the sealing portion comprises:
a first covering layer comprising an insulating inorganic material;
an intermediate layer comprising a material having a linear expansion coefficient different from that of the inorganic material; and
a first buffer layer,
wherein a linear expansion coefficient difference between a material of the first buffer layer and the inorganic material is less than a linear expansion coefficient difference between the material of the intermediate layer and the inorganic material.

BRIEF DESCRIPTION OF THE DRAWINGS

The above object and other objects, features, and advantages will become more apparent from the following descriptions of the preferred embodiments and the accompanying drawings.

DESCRIPTION OF EMBODIMENTS

Hereinafter, embodiments of the present invention will be described with reference to the drawings. In all drawings, the same constituent components are denoted by the same reference signs, and descriptions will not be repeated.

Figure 1:
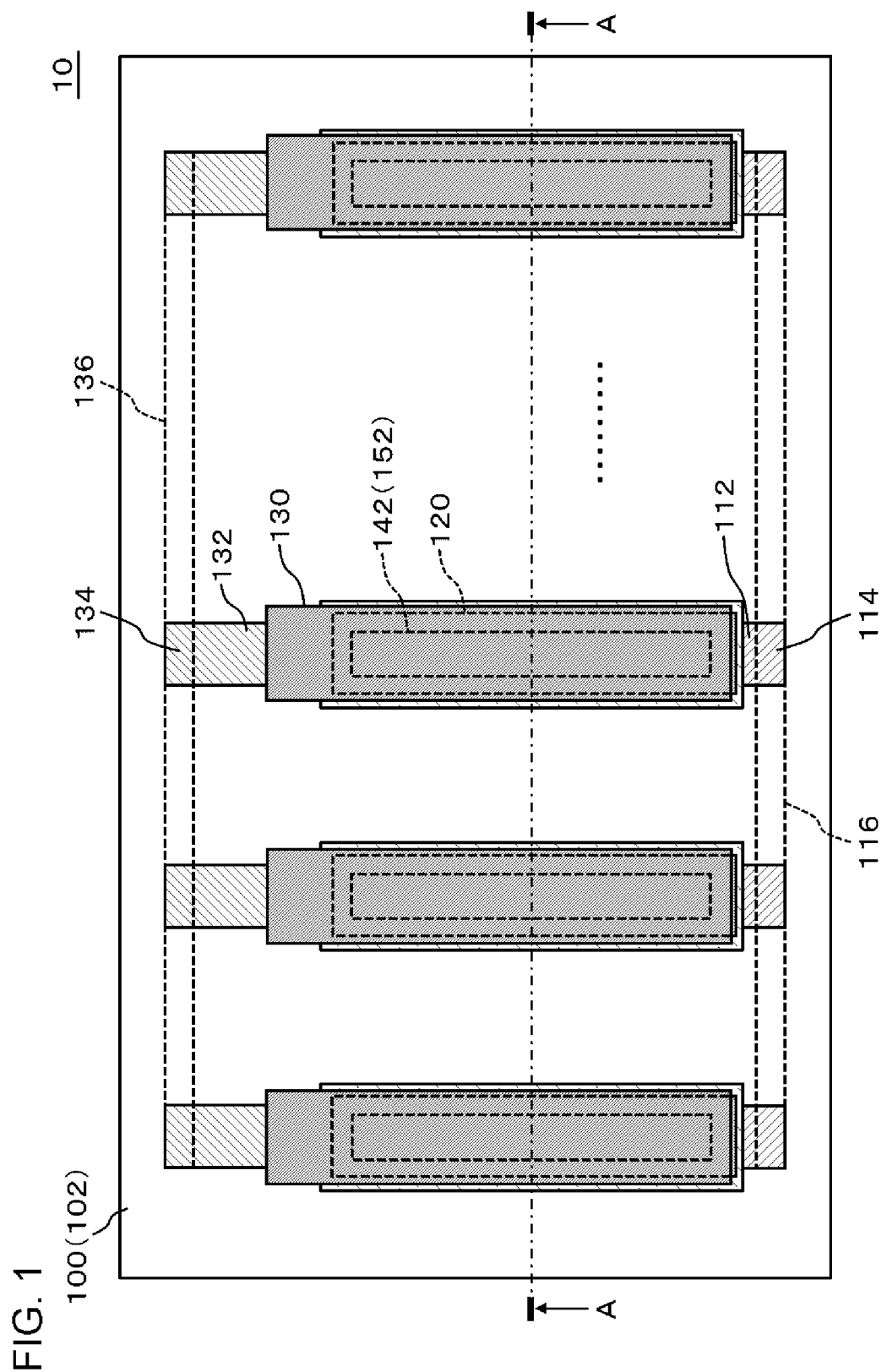
FIG. 1 is a plan view illustrating a light emitting device according to an embodiment.
Figure 2:
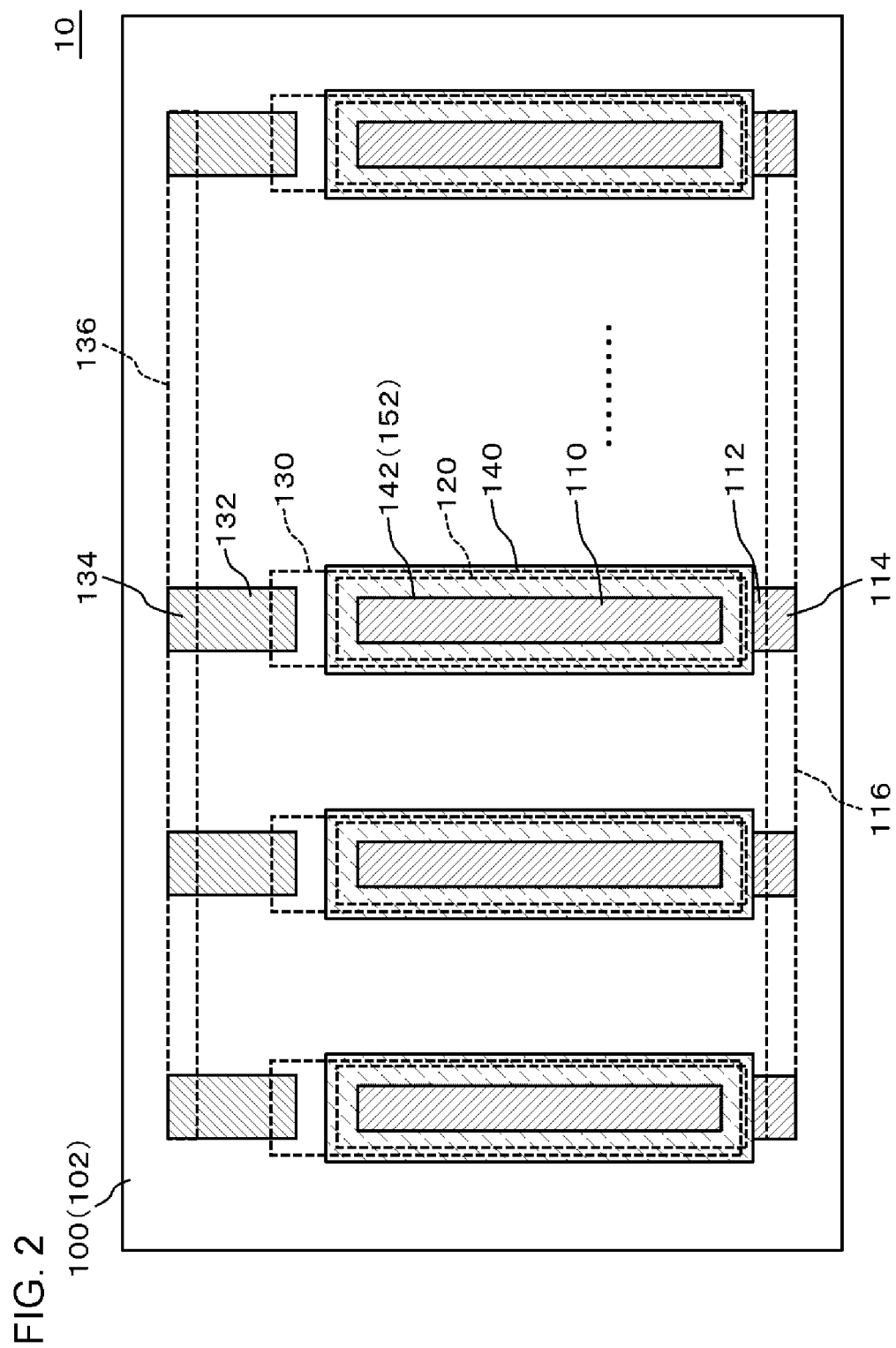
FIG. 2 is a diagram with an organic layer and a second electrode removed from FIG. 1.
Figure 3:
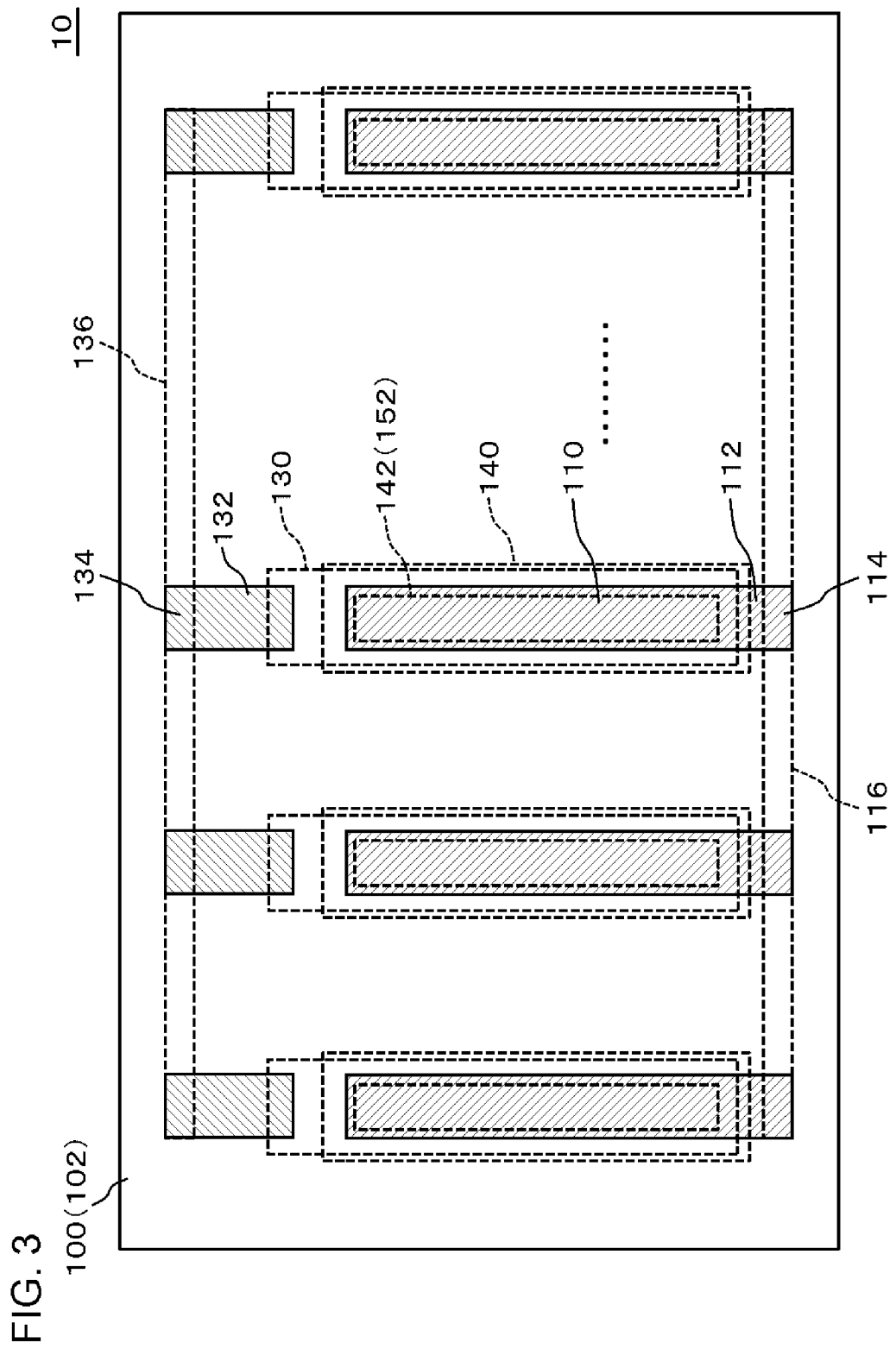
FIG. 3 is a diagram with an insulating layer removed from FIG. 2.
Figure 4:
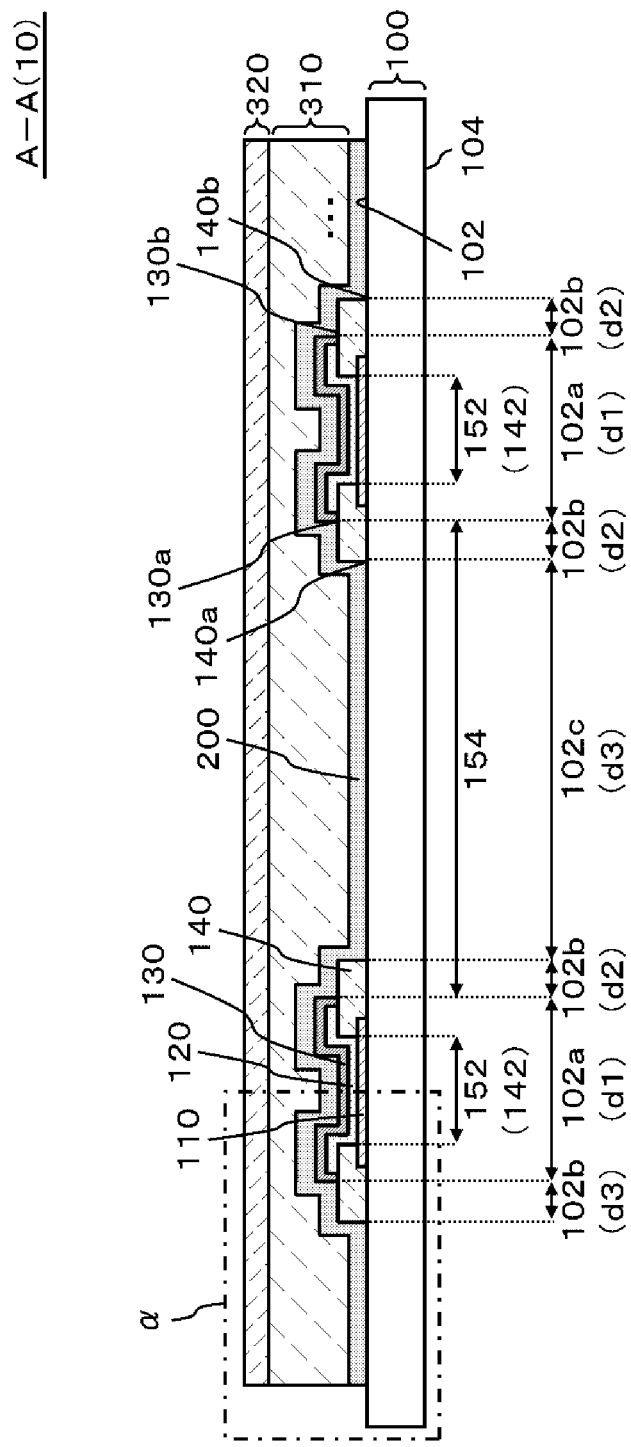
FIG. 4 is a sectional view taken along line A-A in FIG. 1.
Figure 5:
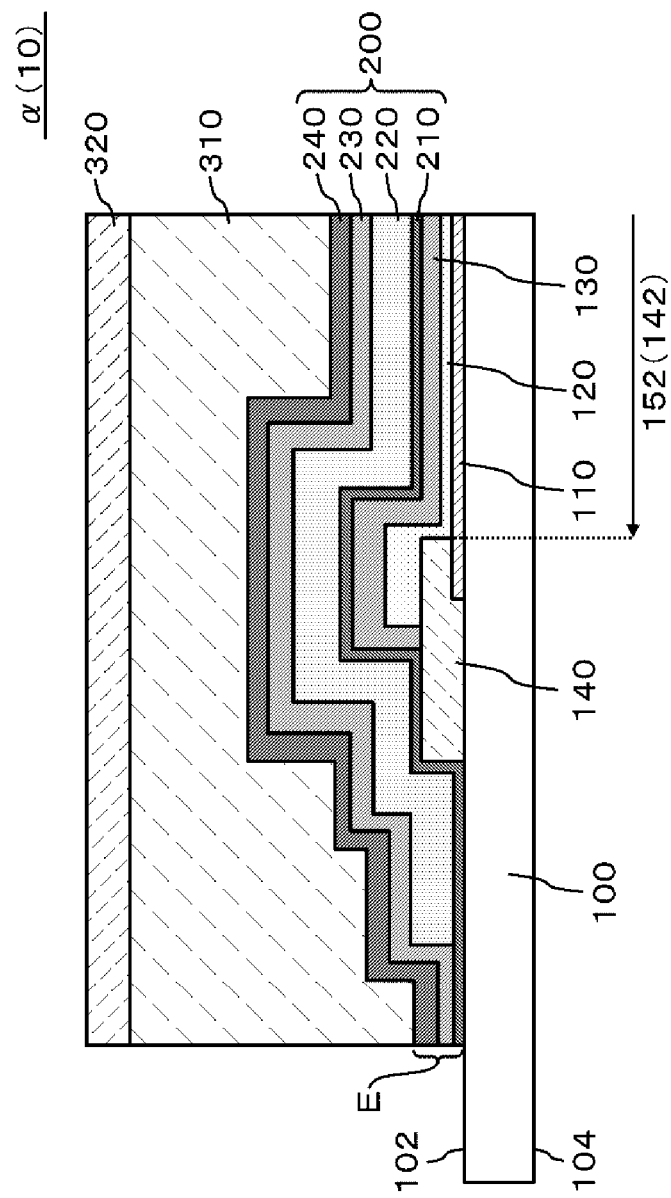
FIG. 5 is an enlarged diagram of a region a illustrated in FIG. 4.

FIG. 1 is a plan view illustrating a light emitting device 10 according to an embodiment. FIG. 2 is a diagram with an organic layer 120 and a second electrode 130 removed from FIG. 1. FIG. 3 is a diagram with an insulating layer 140 removed from FIG. 2. FIG. 4 is a sectional view taken along line A-A in FIG. 1. FIG. 5 is an enlarged diagram of a region a illustrated in FIG. 4. For descriptions, FIGS. 1 to 3 do not illustrate a sealing portion 200 (FIG. 4), an adhesive layer 310 (FIG. 4), and a protective layer 320 (FIG. 4).

The outline of the light emitting device 10 will be described with reference to FIG. 5. The light emitting device 10 includes a light emitting portion 152 and the sealing portion 200. The light emitting portion 152 is positioned at a first surface 102 side of the substrate 100. The light emitting portion 152 has a stacked structure of a first electrode 110, the organic layer 120, and the second electrode 130. The organic layer 120 includes an emission layer. The sealing portion 200 covers the light emitting portion 152. The sealing portion 200 includes a covering layer (first covering layer) 240, an intermediate layer 220, and a buffer layer (first buffer layer) 230. The covering layer 240 is formed by atomic layer deposition (ALD) and contains an insulating inorganic material. The intermediate layer 220 contains a material having a linear expansion coefficient different from that of a material of the covering layer 240. The buffer layer 230 has a surface in contact with the intermediate layer 220, that is, a first surface. The buffer layer 230 has a surface in contact with the covering layer 240, that is, a second surface. In the example illustrated in this figure, the first surface of the buffer layer 230 is a lower surface of the buffer layer 230. The second surface of the buffer layer 230 is opposite to the first surface of the buffer layer 230 and is an upper surface of the buffer layer 230.

A linear expansion coefficient difference between the material of the buffer layer 230 and the inorganic material of the covering layer 240 is less than a linear expansion coefficient difference between the material of the intermediate layer 220 and the inorganic material of the covering layer 240. That is, the linear expansion coefficient difference between the material of the covering layer 240 and a material in a region in contact with the covering layer 240 (that is, the buffer layer 230) in the example illustrated in FIG. 5 can be less than the linear expansion coefficient difference between the material of the covering layer 240 and a material in a region in contact with the covering layer 240 (that is, the intermediate layer 220) when the intermediate layer 220 and the covering layer 240 are directly in contact with each other. Thus, the example illustrated in FIG. 5 enables to prevent cracking of the covering layer 240 due to the linear expansion coefficient difference between the material of the covering layer 240 and the material in the region in contact with the covering layer 240 (that is, the buffer layer 230).

In particular, the buffer layer 230 preferably contains a material having high ductility. In one example, the buffer layer 230 contains a material having ductility greater than that of at least one of the material of the covering layer 240 and the material of the intermediate layer 220. More preferably, the buffer layer 230 contains a material having ductility greater than that of both the material of the covering layer 240 and the material of the intermediate layer 220. Thus, the buffer layer 230 functions to prevent cracking of the covering layer 240. In detail, as described above, the linear expansion coefficient of the material of the intermediate layer 220 and the linear expansion coefficient of the material of the covering layer 240 are different from each other. This would lead somewhat large stress to the covering layer 240 when the intermediate layer 220 and the covering layer 240 were heated, if the intermediate layer 220 and the covering layer 240 were in contact with each other. The covering layer 240 might be cracked by such stress. In the example illustrated in this figure, however, the buffer layer 230 is positioned between the intermediate layer 220 and the covering layer 240, and the material of the buffer layer 230 has somewhat large ductility. Accordingly, the buffer layer 230 may deform to relieve stress from the intermediate layer 220 even if the intermediate layer 220 and the covering layer 240 are heated. Thus, the buffer layer 230 functions to prevent cracking of the covering layer 240.

In particular, in the example illustrated in this figure, the linear expansion coefficient of the material of the intermediate layer 220 is greater than the linear expansion coefficient of the material of the covering layer 240. Further, the intermediate layer 220 is positioned between the substrate 100 and the buffer layer 230. In other words, in a manufacturing process of the light emitting device 10, the intermediate layer 220 is formed, and then the buffer layer 230 and the covering layer 240 are formed on the intermediate layer 220. In such a process, if the covering layer 240 was directly formed on the intermediate layer 220 without forming the buffer layer 230, the covering layer 240 would be in contact with a layer to thermally expand to a great extent, that is, the intermediate layer 220. In such a case, if the intermediate layer 220 and the covering layer 240 were heated in the manufacturing process of the light emitting device 10, the covering layer 240 might be cracked by stress occurring in the covering layer 240. In the example in this figure, however, the buffer layer 230 is positioned between the intermediate layer 220 and the covering layer 240. This prevents cracking of the covering layer 240.

Next, details of a planar layout of the light emitting device 10 will be described with reference to FIGS. 1 to 3. The light emitting device 10 includes a substrate 100, a plurality of first electrodes 110, a plurality of first connection portions 112, a plurality of first terminals 114, a first wiring 116, a plurality of second electrodes 130, a plurality of second connection portions 132, a plurality of second terminals 134, a second wiring 136, and a plurality of insulating layers 140.

As viewed from a direction perpendicular to the first surface 102, the shape of the substrate 100 is a rectangle having a pair of long sides and a pair of short sides. The shape of the substrate 100 is however not limited to that in the example illustrated in this figure. As viewed from a direction perpendicular to the first surface 102, the shape of the substrate 100 may be, for example, a circle or a polygon other than a rectangle.

The plurality of first electrodes 110 are positioned to be spaced apart from each other, and specifically are arranged in line, along the long side of the substrate 100. Each of the plurality of first electrodes 110 extends along the short side of the substrate 100.

Each of the plurality of first electrodes 110 is connected each of to the plurality of first terminals 114 via each of the plurality of first connection portions 112. The plurality of first terminals 114 are connected to each other by the first wiring 116. The first wiring 116 extends along one of the pair of the long sides of the substrate 100. A voltage from the outside of the device is supplied to the first electrode 110 via the first wiring 116, the first terminal 114, and the first connection portion 112. In the example illustrated in this figure, the first electrode 110, the first connection portion 112, and the first terminal 114 are integral with each other. In other words, the light emitting device 10 includes a conductive layer having a region functioning as the first electrode 110, a region functioning as the first connection portion 112, and a region functioning as the first terminal 114.

Each of the plurality of second electrodes 130 overlaps each of the plurality of first electrodes 110. The plurality of second electrodes 130 are positioned to be spaced apart from each other, and specifically are arranged in line, along the long side of the substrate 100. Each of the plurality of second electrodes 130 extends along the short side of the substrate 100, and specifically has a pair of long sides extending along the short side of the substrate 100 and a pair of short sides extending along the long side of the substrate 100.

Each of the plurality of second electrodes 130 is connected to each of the plurality of second terminals 134 via each of the plurality of second connection portions 132. The plurality of second terminals 134 are connected to each other by the second wiring 136. The second wiring 136 faces the first wiring 116 across the plurality of first electrodes 110 and the plurality of second electrodes 130, and extend along the other of the pair of the long sides of the substrate 100. A voltage from the outside of the device is supplied to the second electrode 130 via the second wiring 136, the second terminal 134, and the second connection portion 132. In the example illustrated in this figure, the second connection portion 132 and the second terminal 134 are integral with each other. In other words, the light emitting device 10 includes a conductive layer having a region functioning as the second connection portion 132 and a region functioning as the second terminal 134.

Each of the plurality of insulating layers 140 overlaps each of the plurality of first electrodes 110. The plurality of insulating layers 140 are positioned to be spaced apart from each other, and specifically are arranged in line, along the long side of the substrate 100. Each of the plurality of insulating layers 140 extends along the short side of the substrate 100, and specifically has a pair of long sides extending along the short side of the substrate 100 and a pair of short sides extending along the long side of the substrate 100.

Each of the plurality of insulating layers 140 has an opening 142. As will be described with reference to FIG. 4, in the opening 142, the first electrode 110, the organic layer 120, and the second electrode 130 have a region (stacked structure of the first electrode 110, the organic layer 120, and the second electrode 130) functioning as the light emitting portion 152. In other words, the insulating layer 140 defines the light emitting portion 152. The light emitting portion 152 (opening 142) extends along the short side of the substrate 100, and specifically has a pair of long sides extending along the short side of the substrate 100 and a pair of short sides extending along the long side of the substrate 100.

Next, details of a section of the light emitting device 10 will be described with reference to FIG. 4. The light emitting device 10 includes the substrate 100, the first electrode 110, the organic layer 120, the second electrode 130, the insulating layer 140, the sealing portion 200, the adhesive layer 310, and the protective layer 320. The substrate 100 has the first surface 102 and the second surface 104. The second surface 104 is opposite to the first surface 102. The first electrode 110, the organic layer 120, the second electrode 130, and the insulating layer 140 are over the first surface 102 of the substrate 100. The first electrode 110 functions as an anode. The second electrode 130 functions as a cathode. In the opening 142 of the insulating layer 140, the first electrode 110, the organic layer 120, and the second electrode 130 have a region functioning as the light emitting portion 152. In this region, the first electrode 110, the organic layer 120, and the second electrode 130 overlap each other.

The substrate 100 is light-transmissive. In one example, the substrate 100 contains glass. In another example, the substrate 100 may contain resin.

The first electrode 110 is light-transmissive and conductive. Specifically, the first electrode 110 contains a light-transmissive and conductive material, for example, metal oxide, specifically, for example, at least one of indium tin oxide (ITO) and indium zinc oxide (IZO). Thus, light from the organic layer 120 can be transmitted through the first electrode 110.

The organic layer 120 includes a hole injection layer, a hole transport layer, an emission layer, an electron transport layer, and an electron injection layer, for example. The hole injection layer and the hole transport layer are connected to the first electrode 110. The electron transport layer and the electron injection layer are connected to the second electrode 130. The emission layer emits light by a voltage between the first electrode 110 and the second electrode 130.

The second electrode 130 is light-reflective and conductive. Specifically, the second electrode 130 contains a light-reflective and conductive material, for example, metal, specifically, for example, at least one of Al, Ag, and MgAg. Thus, light from the organic layer 120 is reflected by the second electrode 130 with being hardly transmitted through the second electrode 130. In other words, in the example illustrated in this figure, the light emitting device 10 is a bottom-emission. Almost of light from the organic layer 120 is emitted from the second surface 104 side.

The second electrode 130 is light-blocking by the light reflectivity of the second electrode 130. Accordingly, in the example illustrated in this figure, light from the organic layer 120 is prevented from leaking from the second electrode 130.

The insulating layer 140 is light-transmissive. In one example, the insulating layer 140 contains an organic insulating material, specifically, for example, polyimide. In another example, the insulating layer 140 may contain an inorganic insulating material, specifically, for example, silicon oxide ($SiO_x$), silicon oxynitride (SiON), or silicon nitride ($SiN_x$).

The sealing portion 200 seals a plurality of light emitting portions 152. The sealing portion 200 extends over the plurality of light emitting portions 152. In other words, the first surface 102 of the substrate 100 is covered between two adjacent light emitting portions 152 by the sealing portion 200.

The protective layer 320 is over the sealing portion 200 and is fixed to the first surface 102 of the substrate 100 via the adhesive layer 310. The protective layer 320 is provided to protect the light emitting portion 152 from physical impacts. The protective layer 320 is an Al foil, for example.

As illustrated in this figure, the second electrode 130 has an end portion 130a and an end portion 130b, the insulating layer 140 has an end portion 140a and an end portion 140b. The end portion 130a and the end portion 140a are directed toward the same direction. The end portion 130b and the end portion 140b are directed toward the same direction, and are opposite to the end portion 130a and the end portion 140a, respectively.

The first surface 102 of the substrate 100 has a plurality of regions 102a, a plurality of regions 102b, and a plurality of regions 102c. Each of the plurality of regions 102a extends from a position overlapping the end portion 130a of the second electrode 130 to a position overlapping the end portion 130b thereof. Each of the plurality of regions 102b extends from a position overlapping the end portion 130a of the second electrode 130 to a position overlapping the end portion 140a of the insulating layer 140 (or from a position overlapping the end portion 130b of the second electrode 130 to a position overlapping the end portion 140b of the insulating layer 140).

Each of the plurality of regions 102c extends from a position overlapping the end portion 140a of one of two adjacent insulating layers 140 to a position overlapping the end portion 140b of the other insulating layer 140.

The region 102a overlaps the second electrode 130. Accordingly, the light emitting device 10 has the lowest light transmittance in a region overlapping the region 102a among regions which overlap the region 102a, the region 102b, and the region 102c. The region 102c does not overlap any of the second electrode 130 and the insulating layer 140. Accordingly, the light emitting device 10 has the highest light transmittance in a region overlapping the region 102c among the regions which overlap the region 102a, the region 102b, and the region 102c. The region 102b does not overlap the second electrode 130 but the insulating layer 140. Accordingly, in the region overlapping the region 102b, the light emitting device 10 has light transmittance greater than light transmittance in the region overlapping the region 102a and less than light transmittance in the region overlapping the region 102c.

In the example illustrated in this figure, the light transmittance is high over the entirety of the light emitting device 10. In detail, in the example illustrated in this figure, the width of the region having high light transmittance, that is, the width d3 of the region 102c is wide, and specifically is wider than the width d2 of the region 102b (d3>d2). Thus, the light transmittance is high over the entirety of the light emitting device 10.

In the example illustrated in this figure, the light emitting device 10 is prevented from absorbing a large amount of light having a specific wavelength. In detail, in the example illustrated in this figure, the width of a region in which light is transmitted through the insulating layer 140, that is, the width d2 of the region 102b is narrow, and specifically is narrower than the width d3 of the region 102c (d2<d3). The insulating layer 140 may absorb light having a specific wavelength. Even in such a case, in the example illustrated in this figure, the quantity of light transmitted through the insulating layer 140 is small. This prevents the light emitting device 10 from absorbing a large amount of light having a specific wavelength.

The width d3 of the region 102c may be wider than the width d1 of the region 102a (d3>d1), be narrower than the width d1 of the region 102a (d3<d1), or be equal to the width d1 of the region 102a (d3=d1).

In one example, a ratio d2/d1 of the width d2 of the region 102b to the width d1 of the region 102a is equal to or greater than 0 and equal to or less than 0.2 (0≤d2/d1≤0.2). A ratio d3/d1 of the width d3 of the region 102c to the width d1 of the region 102a is equal to or greater than 0.3 and equal to or less than 2 (0.3≤d3/d1≤2). More specifically, in one example, the width d1 of the region 102a is equal to or greater than 50 μm and equal to or less than 500 μm. The width d2 of the region 102b is equal to or greater than 0 μm and equal to or less than 100 μm. The width d3 of the region 102c is equal to or greater than 15 μm and equal to or less than 1000 μm.

In the example illustrated in this figure, the light emitting device 10 functions as a semi-transmissive OLED. Specifically, a region which does not overlap the second electrode 130 functions as a light transmission portion 154. Thus, in the light emitting device 10, the plurality of light emitting portions 152 and a plurality of light transmission portions 154 are alternately arranged. When light is not emitted from the plurality of light emitting portions 152, human vision perceives that an object on the first surface 102 side is seen through from the second surface 104 side, and an object on the second surface 104 side is seen through from the first surface 102 side. Further, light from the plurality of light emitting portions 152 is mainly output from the second surface 104 side, but is hardly output from the first surface 102 side. When light is emitted from the plurality of light emitting portions 152, human vision perceives that an object on the second surface 104 side is seen through from the first surface 102 side.

In one example, the light emitting device 10 can be used as a high mount stop lamp of an automobile. In this case, the light emitting device 10 can be attached to a rear window of the automobile. Further, in this case, the light emitting device 10 emits red light, for example.

Next, details of the sealing portion 200 will be described with reference to FIG. 5. The sealing portion 200 includes the covering layer (second covering layer) 210, the intermediate layer 220, the buffer layer (first buffer layer) 230, and the covering layer (first covering layer) 240. The covering layer 210 covers the first surface 102 of the substrate 100, the insulating layer 140, and the second electrode 130. The intermediate layer 220 covers the upper surface of the covering layer 210. The intermediate layer 220 does not cover the entirety of the upper surface of the covering layer 210. The end portion of the intermediate layer 220 is positioned inward of the end portion of the covering layer 210 (that is, closer to the light emitting portion 152). The buffer layer 230 covers the upper surface and an end surface of the intermediate layer 220 and extends outward of the intermediate layer 220. The covering layer 240 covers the upper surface of the buffer layer 230.

The covering layer 210 is provided to prevent substances to deteriorate the light emitting portion 152 (for example, water or oxygen) from intruding into the light emitting portion 152, in particular, the organic layer 120. The covering layer 210 is formed by ALD and contains an insulating inorganic material.

In one example, the thickness of the covering layer 210 is equal to or greater than 10 nm and equal to or less than 300 nm. From a viewpoint of sealing the light emitting portion 152 with high reliability, the thickness of the covering layer 210 is preferably somewhat thick, and is equal to or greater than 10 nm as described above, preferably equal to or greater than 40 nm. On the contrary, from a viewpoint of reducing stress of the covering layer 210 and reducing time required for deposition of the covering layer 210, the thickness of the covering layer 210 is preferably somewhat thin, and is equal to or less than 300 nm as described above, preferably equal to or less than 100 nm.

The intermediate layer 220 is provided to fix foreign substances covered by the covering layer 210. In one example, the intermediate layer 220 is a resin layer, and specifically, for example, contains thermosetting or photosetting epoxy resin or contains acrylic resin. In detail, when foreign substances are positioned on the first surface 102 of the substrate 100 before the covering layer 210 is formed by ALD, the foreign substances are covered by the covering layer 210 after the covering layer 210 is formed. The covering layer 210 may be cracked by moving the foreign substances. In the example illustrated in this figure, the intermediate layer 220 is provided to fix such foreign substances.

In one example, the thickness of the intermediate layer 220 is equal to or greater than 1 μm or equal to or less than 300 μm. From a viewpoint of fixing the above foreign substances, the intermediate layer 220 is preferably formed to bury the foreign substances. In other words, the thickness of the intermediate layer 220 is preferably somewhat thick, and is equal to or greater than 1 μm as described above, preferably equal to or greater than 5 μm. On the contrary, from a viewpoint of increasing light transmittance of the light emitting device 10, the thickness of the intermediate layer 220 is preferably somewhat thin, and is equal to or less than 300 µm as described above, preferably equal to or less than 100 µm.

The buffer layer 230 is provided to relieve stress from the intermediate layer 220. As described above, the buffer layer 230 may deform to relieve stress from the intermediate layer 220. In one example, the buffer layer 230 is a metal layer (that is, layer having high ductility), and specifically contains aluminum, for example, and more specifically is, for example, an aluminum layer an aluminum alloy layer (for example, Al/Mn-based alloy layer). In particular, when the intermediate layer 220 is a resin layer, that is, a layer containing a material having a high linear expansion coefficient, the buffer layer 230 preferably has high ductility, and specifically is preferably a metal layer as described above. From a viewpoint of cost, it is preferable that the buffer layer 230 is an aluminum layer. In the example, the buffer layer 230 may deform to relieve stress from the intermediate layer 220.

In one example, the thickness of the buffer layer 230 is equal to or greater than 10 nm and equal to or less than 10 µm when the buffer layer 230 is a metal layer. From a viewpoint of relieving stress from the intermediate layer 220, the thickness of the buffer layer 230 is preferably somewhat thick, and is equal to or greater than 10 nm as described above, preferably equal to or greater than 50 nm. On the contrary, from a viewpoint of increasing light transmittance of the light emitting device 10, the thickness of the buffer layer 230 is preferably somewhat thin, and is equal to or less than 10 µm as described above, preferably equal to or less than 300 nm.

The covering layer 240 is provided to prevent substances to deteriorate the light emitting portion 152 (for example, water or oxygen) from intruding into the light emitting portion 152, in particular, the organic layer 120. The covering layer 240 is formed by ALD and contains an insulating inorganic material. In the example illustrated in this figure, the covering layer 240 is not in contact with the intermediate layer 220, and the buffer layer 230 is positioned between the covering layer 240 and the intermediate layer 220. Accordingly, there is almost no possibility of cracking of the covering layer 240 even if the intermediate layer 220 thermally expands to a great extent.

In one example, the thickness of the covering layer 240 is equal to or greater than 10 nm and equal to or less than 300 nm. From a viewpoint of sealing the light emitting portion 152 with high reliability, the thickness of the covering layer 240 is preferably somewhat thick, and is equal to or greater than 10 nm as described above, preferably equal to or greater than 40 nm. On the contrary, from a viewpoint of reducing stress of the covering layer 240 and reducing time required for deposition of the covering layer 240, the thickness of the covering layer 240 is preferably somewhat thin, and is equal to or less than 300 nm as described above, preferably equal to or less than 100 nm.

As described above, the covering layer 210 and the covering layer 240 are formed by ALD. In a first example, each of the covering layer 210 and the covering layer 240 contains oxide, specifically at least one selected from a group consisting of aluminum oxide ($Al_2O_3$), hafnium oxide ($HfO_2$), hafnium silicate ($HfSiO_3$), lanthanum oxide ($La_2O_3$), silicon oxide ($SiO_2$), strontium titanate (STO), tantalum oxide ($Ta_2O_5$), titanium oxide ($TiO_2$), and zinc oxide (ZnO). In a second example, each of the covering layer 210 and the covering layer 240 contains nitride, specifically at least one selected from a group consisting of aluminum nitride (AlN), hafnium nitride (HfN), silicon nitride ($SiN_x$), tantalum nitride (TaN), and titanium nitride (TiN).

The material of the covering layer 210 and the material of the covering layer 240 may be the same as each other or may be different from each other. In one example, both of the covering layer 210 and the covering layer 240 contain aluminum oxide ($Al_2O_3$).

In the example illustrated in this figure, the lower surface (first surface) of the covering layer 210 is in contact with the light emitting portion 152 (that is, the upper surface of the second electrode 130) in a region overlapping the light emitting portion 152. The upper surface (second surface) of the covering layer 210 is in contact with the intermediate layer 220 in a region overlapping the light emitting portion 152.

In the example illustrated in this figure, substances to deteriorate the light emitting portion 152 (for example, water or oxygen) are prevented from intruding the light emitting portion 152 from the upper surface of the sealing portion 200 with high reliability. Specifically, both of the covering layer 210 and the covering layer 240 are formed by ALD, thus securing high sealability. The light emitting portion 152 is covered by two ALD-formed layers (the covering layer 210 and the covering layer 240). This prevents substances to deteriorate the light emitting portion 152 (for example, water or oxygen) from intruding into the light emitting portion 152 from the upper surface of the sealing portion 200 with high reliability.

In the example illustrated in this figure, the lower surface (first surface) of the intermediate layer 220 has a region in contact with the first surface 102 of the substrate 100, outside the light emitting portion 152, more specifically, between the end portion of the insulating layer 140 and the end portion E of the sealing portion 200. Meanwhile, the upper surface (second surface) of the intermediate layer 220 has a region in contact with the buffer layer 230, outside the light emitting portion 152, more specifically, at the end portion E of the sealing portion 200 and the periphery thereof. Thus, the end portion E of the sealing portion 200 has a stacked structure of the covering layer 210 (layer formed by ALD), the buffer layer 230 (metal layer), and the covering layer 240 (layer formed by ALD).

In the example illustrated in this figure, substances to deteriorate the light emitting portion 152 (for example, water or oxygen) can be prevented from intruding into the light emitting portion 152 from the end portion E of the sealing portion 200 with high reliability. Specifically, both of the covering layer 210 and the covering layer 240 are formed by ALD, thus securing high sealability. When the buffer layer 230 is a metal layer, the buffer layer 230 also can secure high sealability. The end portion E of the sealing portion 200 has a stacked structure of the covering layer 210, the buffer layer 230, and the covering layer 240. Thus, in the example illustrated in this figure, substances to deteriorate the light emitting portion 152 (for example, water or oxygen) can be prevented from intruding into the light emitting portion 152 from the end portion E of the sealing portion 200 with high reliability.

In the example illustrated in this figure, it is possible to reinforce resistance of the end portion E of the sealing portion 200 against impacts from the outside. Specifically, the buffer layer 230 is exposed from the end portion E of the sealing portion 200, in addition to the covering layer 210 and the covering layer 240. Both of the covering layer 210 and the covering layer 240 are formed by ALD. Accordingly, resistance of the covering layer 210 and the covering layer 240 against impacts from the outside may be weak. The resistance of the buffer layer 230 against impacts from the outside is however strong due to the high ductility of the buffer layer 230. In other words, a layer having strong resistance against impacts from the outside (that is, buffer layer 230) is exposed from the end portion E of the sealing portion 200. Thus, in the example illustrated in this figure, it is possible to reinforce resistance of the end portion E of the sealing portion 200 against impacts from the outside.

Next, a method of manufacturing the light emitting device 10 illustrated in FIGS. 1 to 5 will be described.

First, the first electrode 110, the first connection portion 112, the first terminal 114, the second connection portion 132, and the second terminal 134 are formed over the first surface 102 of the substrate 100. In one example, the first electrode 110, the first connection portion 112, the first terminal 114, the second connection portion 132, and the second terminal 134 are formed by patterning a sputter-formed conductive layer.

Then, the insulating layer 140 is formed. In one example, the insulating layer 140 is formed by patterning photosensitive resin applied onto the first surface 102 of the substrate 100. Then, the organic layer 120 is formed. In one example, the organic layer 120 is formed by vapor deposition. In another example, the organic layer 120 may be formed by application. In this case, a material of the organic layer 120 is applied inside the opening 142 of the insulating layer 140. Then, the second electrode 130 is formed. In one example, the second electrode 130 is formed by vacuum deposition with a mask.

Then, the covering layer 210 is formed by ALD. In this case, when foreign substances are positioned on the first surface 102 of the substrate 100 before the covering layer 210 is formed, the foreign substances are covered by the covering layer 210.

Then, the intermediate layer 220 is formed. If the intermediate layer 220 is a resin layer, the intermediate layer 220 is formed by chemical vapor deposition (CVD) in one example. As described above, the foreign substances may be covered by the covering layer 210. The covering layer 210 may be cracked by moving the foreign substances. The intermediate layer 220 is provided to fix the foreign substances.

Then, the buffer layer 230 is formed. If the buffer layer 230 is a metal layer, the buffer layer 230 is formed by CVD in one example. If the buffer layer 230 is a metal layer, the buffer layer 230 may be formed by sputtering in another example.

Then, the covering layer 240 is formed by ALD. Before the covering layer 240 is formed, the intermediate layer 220 is covered by the buffer layer 230. Accordingly, the covering layer 240 is not in contact with the intermediate layer 220 and but is in contact with the buffer layer 230. In this case, even if the intermediate layer 220 thermally expands to a great extent, the buffer layer 230 may deform to relieve stress from the intermediate layer 220. Thus, the buffer layer 230 functions to prevent cracking of the covering layer 240.

In particular, in the manufacturing process of the light emitting device 10, the intermediate layer 220 may be heated at a somewhat high temperature, after the intermediate layer 220 is formed. In this case, the intermediate layer 220 expands to a somewhat great extent. In the embodiment, even if the intermediate layer 220 expands to a great extent as described above, the buffer layer 230 is positioned between the intermediate layer 220 and the covering layer 240. This prevents cracking of the covering layer 240.

Then, the adhesive layer 310 is formed. Then, the protective layer 320 is fixed via the adhesive layer 310.

Thus, the light emitting device 10 illustrated in FIGS. 1 to 5 is manufactured.

Figure 6:
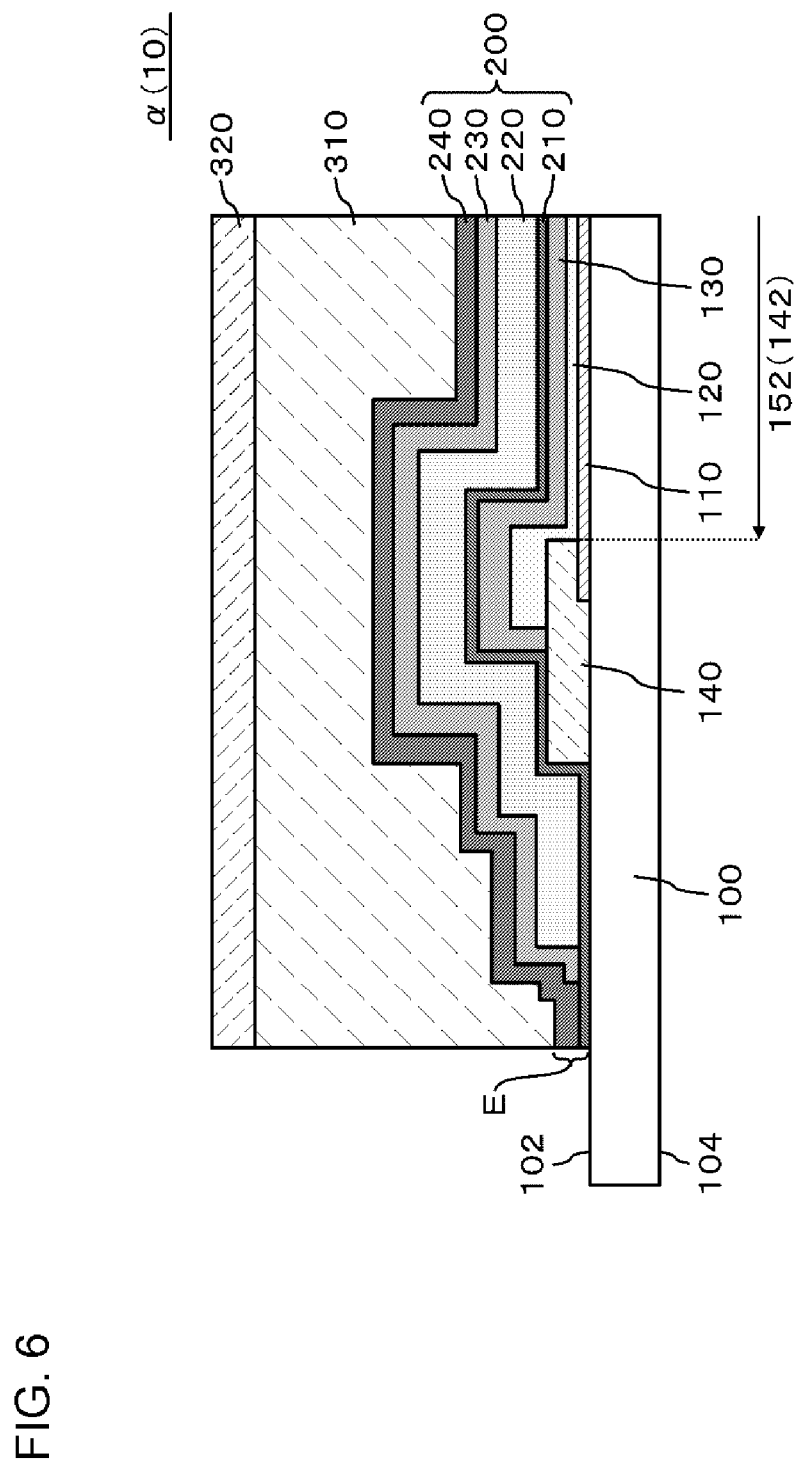
FIG. 6 is a diagram illustrating a first modification example of FIG. 5.

FIG. 6 is a diagram illustrating a first modification example of FIG. 5. In the example illustrated in this figure, the end portion of the buffer layer 230 is positioned inward of both of the end portion of the covering layer 210 and the end portion of the covering layer 240 (that is, closer to the light emitting portion 152). In other words, the covering layer 210 and the covering layer 240 extend outward of the buffer layer 230. Thus, the covering layer 240 covers the upper surface and the end surface of the buffer layer 230. In other words, the end portion of the buffer layer 230 is not exposed from the end portion E of the sealing portion 200. Thus, the end portion E of the sealing portion 200 has a stacked structure of the covering layer 210 and the covering layer 240.

In the example illustrated in this figure, substances to deteriorate the light emitting portion 152 (for example, water or oxygen) are prevented from intruding into the light emitting portion 152 from the end portion E of the sealing portion 200 with high reliability. Specifically, both of the covering layer 210 and the covering layer 240 are formed by ALD, thus securing high sealability. The end portion E of the sealing portion 200 has a stacked structure of the covering layer 210 and the covering layer 240. Thus, in the example illustrated in this figure, substances to deteriorate the light emitting portion 152 (for example, water or oxygen) are prevented from intruding the light emitting portion 152 from the end portion E of the sealing portion 200 with high reliability.

Figure 7:
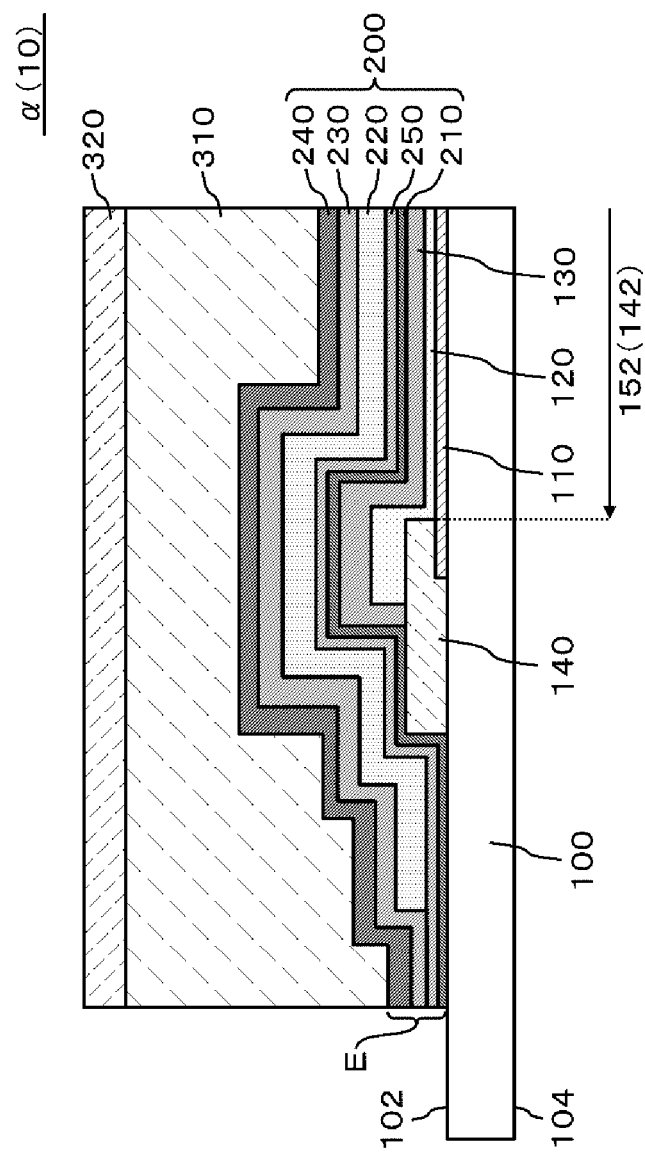
FIG. 7 is a diagram illustrating a second modification example of FIG. 5.

FIG. 7 is a diagram illustrating a second modification example of FIG. 5. In the example illustrated in this figure, the sealing portion 200 includes the covering layer 210 (second covering layer), the buffer layer 250 (second buffer layer), the intermediate layer 220, the buffer layer 230 (first buffer layer), and the covering layer 240 (first covering layer). The intermediate layer 220 contains a material having a linear expansion coefficient different from that of a material of the covering layer 210. The buffer layer 250 has a surface in contact with the covering layer 210, that is, a first surface. The buffer layer 250 has a surface in contact with the intermediate layer 220, that is, a second surface. In the example illustrated in this figure, the first surface of the buffer layer 250 is the lower surface of the buffer layer 250. The second surface of the buffer layer 250 is opposite to the first surface of the buffer layer 250 and is an upper surface of the buffer layer 250.

A linear expansion coefficient difference between the material of the buffer layer 250 and the inorganic material of the covering layer 210 is less than a linear expansion coefficient difference between the material of the intermediate layer 220 and the inorganic material of the covering layer 210. That is, the linear expansion coefficient difference between the material of the covering layer 210 and the material in a region in contact with the covering layer 210 (that is, the buffer layer 250) in the example illustrated in FIG. 7 can be less than the linear expansion coefficient difference between the material of the covering layer 210 and the material in a region in contact with the covering layer 210 (that is, the intermediate layer 220) when the intermediate layer 220 and the covering layer 210 are directly in contact with each other. Thus, the example illustrated in FIG. 7 enables to prevent cracking of the covering layer 210 due to the linear expansion coefficient difference between the material of the covering layer 210 and the material in the region in contact with the covering layer 210 (that is, the buffer layer 250).

In particular, the buffer layer 250 preferably contains a material having high ductility. In one example, the buffer layer 250 contains a material having ductility greater than that of at least one of the material of the covering layer 210 and the material of the intermediate layer 220. More preferably, the buffer layer 250 contains a material having ductility greater than that of both the material of the covering layer 210 and the material of the intermediate layer 220. Thus, the buffer layer 250 functions to prevent cracking of the covering layer 210. In detail, as described above, the linear expansion coefficient of the material of the intermediate layer 220 and the linear expansion coefficient of the material of the covering layer 210 are different from each other. This would lead somewhat large stress to the covering layer 210 when the intermediate layer 220 and the covering layer 210 were heated, if the intermediate layer 220 and the covering layer 210 were in contact with each other. The covering layer 210 might be cracked by such stress. In the example illustrated in this figure, however, the buffer layer 250 is positioned between the intermediate layer 220 and the covering layer 210, and the material of the buffer layer 250 has somewhat large ductility. Accordingly, the buffer layer 250 may deform to relieve stress from the intermediate layer 220 even if the intermediate layer 220 and the covering layer 210 are heated. Thus, the buffer layer 250 functions to prevent cracking of the covering layer 210.

In one example, the buffer layer 250 is a metal layer having high ductility, and specifically contains aluminum, for example, and more specifically is, for example, an aluminum layer or aluminum alloy layer (for example, Al/Mn-based alloy layer). In particular, when the intermediate layer 220 is a resin layer, that is, a layer containing a material having a high linear expansion coefficient, the buffer layer 250 preferably has high ductility, and specifically is preferably a metal layer. From a viewpoint of cost, it is preferable that the buffer layer 250 is an aluminum layer.

In one example, the thickness of the buffer layer 250 is equal to or greater than 10 nm and equal to or less than 10 μm when the buffer layer 250 is a metal layer. From a viewpoint of relieving stress from the intermediate layer 220, the thickness of the buffer layer 250 is preferably somewhat thick, and is equal to or greater than 10 nm as described above, preferably equal to or greater than 50 nm. On the contrary, from a viewpoint of increasing light transmittance of the light emitting device 10, the thickness of the buffer layer 250 is preferably somewhat thin, and is equal to or less than 10 μm as described above, preferably equal to or less than 300 nm.

In the example illustrated in this figure, the end portion of the intermediate layer 220 is positioned inward of both of the end portion of the buffer layer 250 and the end portion of the buffer layer 230 (that is, closer to the light emitting portion 152). In other words, the buffer layer 250 and the buffer layer 230 extend outward of the intermediate layer 220. In other words, the end portion of the intermediate layer 220 is not exposed from the end portion E of the sealing portion 200. Thus, the end portion E of the sealing portion 200 has a stacked structure of the covering layer 210, the buffer layer 250, the buffer layer 230, and the covering layer 240.

In the example illustrated in this figure, substances to deteriorate the light emitting portion 152 (for example, water or oxygen) can be prevented from intruding into the light emitting portion 152 from the end portion E of the sealing portion 200 with high reliability. Specifically, both of the covering layer 210 and the covering layer 240 are formed by ALD, thus securing high sealability. When both of the buffer layer 250 and the buffer layer 230 are metal layers, the buffer layer 250 and the buffer layer 230 also can secure high sealability. The end portion E of the sealing portion 200 has a stacked structure of the covering layer 210, the buffer layer 250, the buffer layer 230, and the covering layer 240. Thus, in the example illustrated in this figure, substances to deteriorate the light emitting portion 152 (for example, water or oxygen) can be prevented from intruding into the light emitting portion 152 from the end portion E of the sealing portion 200 with high reliability.

Figure 8:
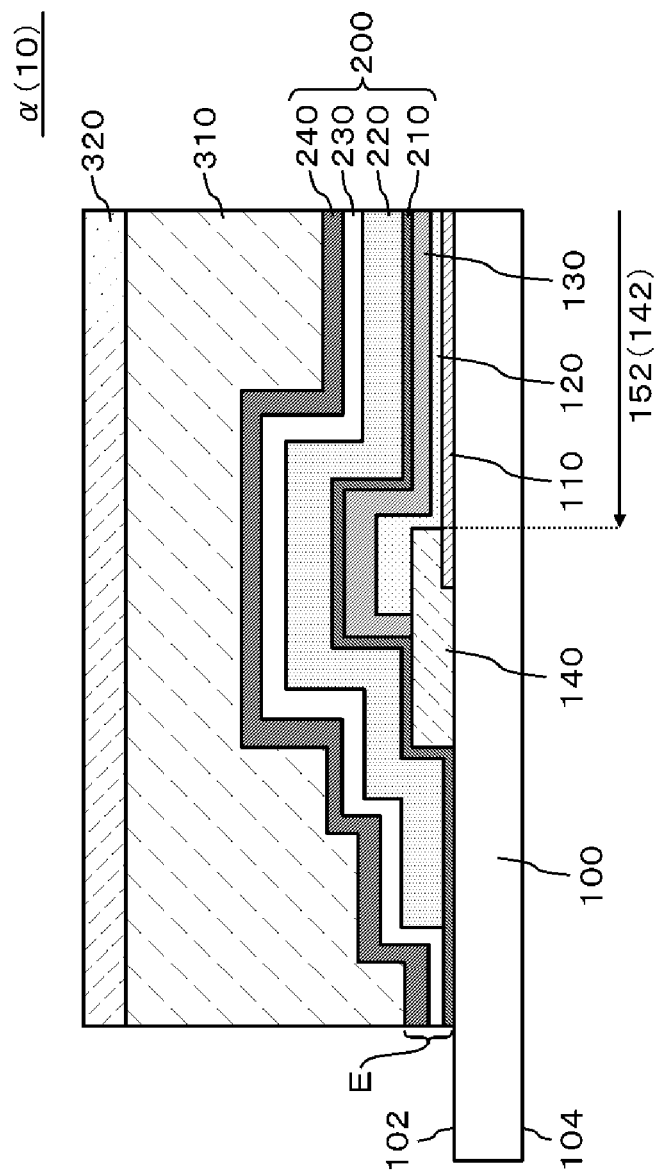
FIG. 8 is a diagram illustrating a third modification example of FIG. 5.

FIG. 8 is a diagram illustrating a third modification example of FIG. 5. In the example illustrated in this figure, the buffer layer 230 contains a light-transmissive inorganic material. The inorganic material is a compound containing Si, more specifically silicon oxide ($SiO_2$), silicon nitride (SiN), or silicon oxynitride (SiON).

Similar to the example illustrated in FIG. 5, also in the example illustrated in this figure, a linear expansion coefficient difference between the material of the buffer layer 230 and the inorganic material of the covering layer 240 is less than a linear expansion coefficient difference between the material of the intermediate layer 220 and the inorganic material of the covering layer 240. Thus, it is possible to prevent cracking of the covering layer 240 due to the linear expansion coefficient difference between the material of the covering layer 240 and the material in the region in contact with the covering layer 240 (that is, buffer layer 230).

Further, in the example illustrated in this figure, both of high light transmittance and high gas barrier properties can be realized. Specifically, as described above, the buffer layer 230 is light-transmissive. Thus, the light transmittance of the light transmission portion 154 can be increased even if a portion of the buffer layer 230 is positioned in the light transmission portion 154. Further, as described above, the buffer layer 230 contains the inorganic material. Generally, the inorganic material has high gas barrier properties. Thus, the high gas barrier properties can be realized.

In the structure illustrated in FIG. 6, the buffer layer 230 may also contain the light-transmissive inorganic material, similar to the buffer layer 230 illustrated in FIG. 8.

Further, in the structure illustrated in FIG. 7, one or both of the buffer layer 230 and the buffer layer 250 may contain the light-transmissive inorganic material, similar to the buffer layer 230 illustrated in FIG. 8.

Hitherto, according to the embodiment, the linear expansion coefficient difference between the material of the buffer layer 230 and the inorganic material of the covering layer 240 is less than the linear expansion coefficient difference between the material of the intermediate layer 220 and the inorganic material of the covering layer 240. Thus, it is possible to prevent cracking of the covering layer 240 due to the linear expansion coefficient difference between the material of the covering layer 240 and the material in the region in contact with the covering layer 240.

The material of the buffer layer 230 and the material of the buffer layer 250 can be materials as follows, for example. The unit of the following linear expansion coefficient is $\times 10^{-6}/°C$.

(1) Metal-Based Material

| Material | Linear expansion coefficient |
| --- | --- |
| Gold | 14.2 |
| Aluminum | 23 |
| Iron | 11.7 |

-continued

| Material | Linear expansion coefficient |
| --- | --- |
| Copper | 16.6 |
| Silver | 19.7 |
| Zinc | 39.7 |
| Tin | 23 |
| Nickel | 13.3 |
| Magnesium | 26 |
| Manganese | 22 |

(2) Alloy-Based Material

| Material | Linear expansion coefficient |
| --- | --- |
| Brass | 18 to 23 |
| Stainless steel | 17 to 18 |
| Cast iron | 10 to 12 |

(3) Ceramic-Based Material

| Material | Linear expansion coefficient |
| --- | --- |
| $Al_2O_3$ | 8 to 9 |
| ZrO2 | 8.7 to 11 |

(4) Others

| Material | Linear expansion coefficient |
| --- | --- |
| Glass | 9 |
| Concrete | 7 to 13 |

Hitherto, the embodiment and examples are described with reference to the drawings. The embodiment and examples are just examples, and various configurations other than the above-described configurations can be employed.

This application claims priority based on Japanese Patent Application No. 2016-192992 filed on Sep. 30, 2016, the disclosure of which is incorporated herein in its entirety.

The invention claimed is:

1. A light emitting device comprising:
a light emitting portion positioned at a first surface side of a substrate and comprising a stacked structure of a first electrode, an organic layer comprising an emission layer, and a second electrode; and
a sealing portion covering the light emitting portion,
wherein the sealing portion comprises:
a first covering layer comprising a first insulating inorganic material;
a second covering layer comprising a second insulating inorganic material,
an intermediate layer comprising a material having a linear expansion coefficient different from that of the first insulating inorganic material and that of the second insulating inorganic material;
a first buffer layer; and
a second buffer layer,
wherein the second covering layer, the second layer, the intermediate layer, the first buffer layer, and the first covering layer are arranged in this order from the light emitting portion side,
wherein an end portion of the intermediate layer is positioned closer to the light emitting portion than both of an end of the first buffer layer and an end of the second buffer layer,
wherein a linear expansion coefficient difference between a material of the first buffer layer and the first insulating inorganic material is less than a linear expansion coefficient difference between the material of the intermediate layer and the first insulating inorganic material, and
wherein a linear expansion coefficient difference between a material of the second buffer layer and the second insulating inorganic material is less than a linear expansion coefficient difference between the material of the intermediate layer and the second insulating inorganic material.

2. The light emitting device according to claim 1,
wherein the linear expansion coefficient of the material of the intermediate layer is greater than the linear expansion coefficient of the first insulating inorganic material, and
the intermediate layer is positioned between the substrate and the first covering layer.

3. The light emitting device according to claim 2,
wherein the intermediate layer is a resin layer.

4. The light emitting device according to claim 3,
wherein the first buffer layer comprises a material having ductility greater than that of at least one of the first insulating inorganic material and the material of the intermediate layer.

5. The light emitting device according to claim 4,
wherein the first buffer layer comprises a material having ductility greater than that of both the first insulating inorganic material and the material of the intermediate layer.

6. The light emitting device according to claim 3,
wherein the first buffer layer is a metal layer.

7. The light emitting device according to claim 6,
wherein a thickness of the first buffer layer is equal to or greater than 10 nm and equal to or less than 10 μm.

8. The light emitting device according to claim 3,
wherein the first buffer layer comprises a light-transmissive inorganic material.

9. The light emitting device according to claim 3,
wherein the first buffer layer is a compound comprising Si.

10. The light emitting device according to claim 3,
wherein the second covering layer comprises a first surface and a second surface opposite to the first surface,
the first surface of the second covering layer comprises a region in contact with the first surface of the substrate outside the light emitting portion.

11. The light emitting device according to claim 10,
wherein an end portion of the sealing portion comprises a stacked structure of the first covering layer, the first buffer layer, and the second covering layer.

12. The light emitting device according to claim 10,
wherein the end portion of the first buffer layer is positioned closer to the light emitting portion than both of an end portion of the first covering layer and an end portion of the second covering layer.

13. The light emitting device according to claim 1,
wherein each of the first covering layer and the second covering layer comprises aluminum oxide.

14. The light emitting device according to claim 1, wherein a thickness of the intermediate layer is equal to or greater than 1 μm and equal to or less than 300 μm.

\* \* \* \* \*